(12) United States Patent
Rocher et al.

(10) Patent No.: US 12,007,426 B2
(45) Date of Patent: Jun. 11, 2024

(54) DEVICE FOR AUTOMATICALLY DETECTING COUPLING BETWEEN ELECTRONIC DEVICES

(71) Applicant: Vitesco Technologies GmbH, Regensburg (DE)

(72) Inventors: Jacques Rocher, Toulouse (FR); Yannick Leroy, Toulouse (FR)

(73) Assignee: Vitesco Technologies GmbH, Regensburg (DE)

( * ) Notice: Subject to any disclaimer, the term of this patent is extended or adjusted under 35 U.S.C. 154(b) by 0 days.

(21) Appl. No.: 18/011,380

(22) PCT Filed: Jul. 12, 2021

(86) PCT No.: PCT/EP2021/069270
§ 371 (c)(1),
(2) Date: Dec. 19, 2022

(87) PCT Pub. No.: WO2022/017843
PCT Pub. Date: Jan. 27, 2022

(65) Prior Publication Data
US 2023/0228801 A1 Jul. 20, 2023

(30) Foreign Application Priority Data
Jul. 21, 2020 (FR) ...................................... 2007635

(51) Int. Cl.
*G01R 31/00* (2006.01)
*G06F 15/177* (2006.01)

(52) U.S. Cl.
CPC ......... *G01R 31/006* (2013.01); *G06F 15/177* (2013.01)

(58) Field of Classification Search
None
See application file for complete search history.

(56) References Cited

U.S. PATENT DOCUMENTS

| | | | |
|---|---|---|---|
| 8,242,752 B2 * | 8/2012 | Minkkinen | G06F 1/266 710/17 |
| 2012/0139615 A1 | 6/2012 | Zimmermann | |
| 2022/0050146 A1 | 2/2022 | Leroy et al. | |

FOREIGN PATENT DOCUMENTS

| | | |
|---|---|---|
| FR | 3090888 A1 | 6/2020 |
| FR | 3090925 A1 | 6/2020 |

OTHER PUBLICATIONS

WO2020127672A1 machine translation Jun. 25, 2020 (Year: 2020).*
English Translation of the Written Opinion for International Application No. PCT/EP2021/069270, dated Nov. 4, 2021, 6 pages.
International Search Report and Written Opinion for International Application No. PCT/EP2021/069270, dated Nov. 4, 2021, 9 pages.
International Search Report and Written Opinion for International Application No. PCT/EP2021/069270, dated Nov. 4, 2021 (French), 13 pages.

* cited by examiner

*Primary Examiner* — Farhana A Hoque
*Assistant Examiner* — Joseph O Nyamogo
(74) *Attorney, Agent, or Firm* — BUCHANAN INGERSOLL & ROONEY PC

(57) ABSTRACT

A method for automatically detecting a sensor coupled to an electronic computer including steps of detecting said sensor and steps of configuring a hardware interface.

1 Claim, 3 Drawing Sheets

DEVICE FOR AUTOMATICALLY DETECTING COUPLING BETWEEN ELECTRONIC DEVICES

CROSS REFERENCE TO RELATED APPLICATIONS

This application is the U.S. National Phase Application of PCT International Application No. PCT/EP2021/069270, filed Jul. 12, 2021, which claims priority to French Patent Application No. 2007635, filed Jul. 21, 2020, the contents of such applications being incorporated by reference herein.

FIELD OF THE INVENTION

The present invention relates generally to the coupling of electronic devices. The invention finds applications, in particular, in the automotive field. It may be implemented, for example, in an electronic computer.

BACKGROUND OF THE INVENTION

A motor vehicle nowadays comprises more and more onboard electronics such as, for example, sensors coupled to electronic computers. These onboard electronics require connection technology of greater or lesser complexity in the motor vehicle.

In the case of an internal combustion engine, sensors are used and coupled to at least one electronic computer such as an engine control computer in order to ensure the correct operation of said internal combustion engine and thus allow better control of fuel consumption and therefore control of the emission of pollutants into the atmosphere.

To produce these sensors, it is known practice in the prior art to use a voltage-source sensor positioned facing a movable notched target. Said sensor generally has three sensor pins for transferring a detection signal in the form of a variation in voltage to the engine control computer.

For a few years, a new sensor technology has been developed: current-source sensors. These sensors deliver information in the form of a variation in current.

Depending on the type of sensor used, there is, at the level of the engine control computer, a different dedicated hardware interface allowing the coupling of said sensor to said engine control computer. This interface allows, with suitable electronics (in the electronic computer), electrical signals which are appropriate for managing, in this case, the internal combustion engine to be generated and received.

Thus, it is necessary, when designing the engine control computer, to modify its hardware interface depending on the type of sensor connected, that is to say a voltage-source sensor or a current-source sensor. Consequently, it is no longer possible, once the choice of sensor has been made, to change the type of sensor, for example over the lifespan of the vehicle, because the hardware interface is not adaptive.

SUMMARY OF THE INVENTION

An aspect of the invention proposes a device for automatically detecting coupling which allows the technical lack in the cited prior art to be partially or wholly remedied.

To this end, an aspect of the invention proposes a method for automatically detecting a sensor coupled to an electronic computer, comprising the following steps:
 a first step e1) consisting in switching a transistor in order, on the one hand, to short a first resistor and, on the other hand, to apply, between a first computer pin and a second computer pin, an impedance of the order of a second resistor,
a second step e2) consisting in reading a signal generated by said sensor coupled to the computer,
a third step e3) consisting in comparing the value of the signal generated by the sensor coupled to the computer with a reference value Vref1,
a fourth step e4), in the event that the result of the comparison is positive, consisting in configuring the hardware interface in voltage-source sensor mode, and in controlling the transistor in open-circuit mode,
a sixth step e6) consisting in a software configuration of the hardware interface which is suitable for allowing the signals delivered by the voltage-source sensor to be read,
a seventh step e7), consisting in monitoring and in detecting information that the starter of the vehicle has been controlled,
an eighth step e8), consisting in checking the presence and the correct operation of the voltage-source sensor coupled between the first computer pin and the second computer pin,
a ninth step e9), which is representative of the correct operation of the voltage-source sensor, consisting in confirming said presence and said correct operation of the voltage-source sensor across the terminals of the computer,
a tenth step e10), which is representative of a potential anomaly of the sensor, consisting in switching the transistor in short-circuit mode,
an eleventh step e11), consisting in a software configuration of the hardware interface which is suitable for allowing the signals delivered by the current-source sensor to be read,
a twelfth step e12), consisting in checking the presence and the correct operation of the current-source sensor coupled between the first computer pin and the second computer pin,
a thirteenth step e13), which is representative of the correct operation of the current-source sensor, consisting in confirming said presence and said correct operation of the current-source sensor across the terminals of the computer,
a fourteenth step e14), which is representative of the presence of an anomaly, consisting in confirming an anomaly at the level of the sensor coupled to the computer,
a fifth step e5) which is representative of a negative comparison result, consisting in configuring the hardware interface in current-source sensor mode, and in the software configuration of the hardware interface in order to allow the signals delivered by the current-source sensor to be read,
a fifteenth step e15), consisting in monitoring and in detecting information that the starter of the vehicle has been controlled,
a sixteenth step e16), consisting in checking the presence and the correct operation of the current-source sensor coupled between the first computer pin and the second computer pin,
a seventeenth step e17), which is representative of the correct operation of the current-source sensor, consisting in confirming said presence and said correct operation of the current-source sensor across the terminals of the computer, an eighteenth step e18), which is representative of the presence of an anomaly and consists in confirming an anomaly at the level of the sensor coupled to the computer.

Advantageously, it is possible to detect the presence and the correct operation of a sensor coupled to the computer. Furthermore, by virtue of an aspect of the invention it is possible to detect and configure the computer depending on the type of coupled sensor without hardware modification of said computer.

BRIEF DESCRIPTION OF THE DRAWINGS

One preferred exemplary embodiment of the invention will now be described with reference to the appended drawings, in which.

DETAILED DESCRIPTION OF THE PREFERRED EMBODIMENTS

Figure 1:
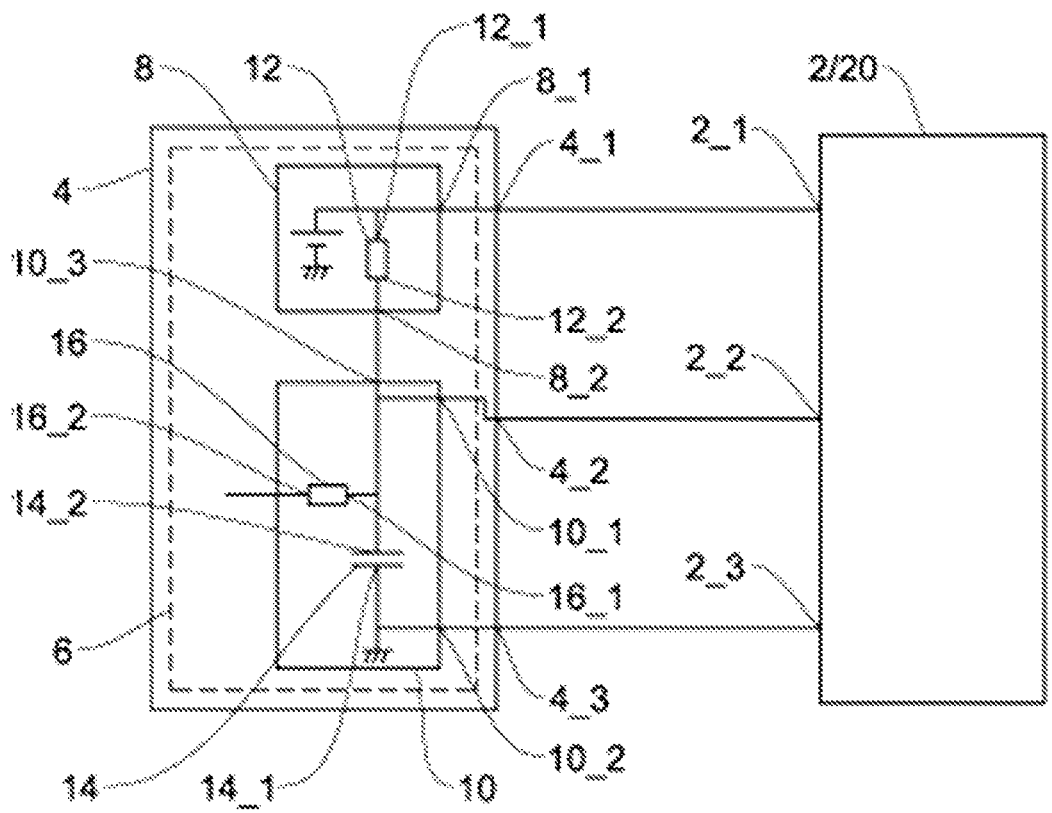
FIG. 1 shows a schematic view of a computer of the prior art coupled to a voltage-source sensor.

FIG. 1 illustrates a voltage-source sensor 2 of the prior art coupled, for example, to an engine control computer 4. The voltage-source sensor 2 is, for example, a sensor dedicated to detecting the positioning of a camshaft of an internal combustion engine through the movement of teeth of said target in front of said voltage-source sensor 2.

Such a voltage-source sensor 2 generally comprises three pins with a first sensor pin 2_1 coupled, for example, to a first computer pin 4_1 and suitable for supplying said voltage-source sensor 2 with electrical power; a second sensor pin 2_2 coupled to a second computer pin 4_2 dedicated to receiving a signal which is representative of the position of the camshaft; and finally a third sensor pin 2_3 coupled to a third computer pin 4_3 which is generally coupled to an electrical ground of the motor vehicle. The internal structure of the voltage-source sensor 2 is well known to a person skilled in the art; it will therefore not be presented in detail here.

The engine control computer 4 has a hardware interface 6 comprising, for example, a sensor power-supply module 8 and a signal processing module 10.

The sensor power-supply module 8 is suitable for supplying electrical power to the voltage-source sensor 2. For this purpose, it has a first sensor power-supply module pin 8_1 suitable for generating said electrical power supply for said voltage-source sensor 2 through the first computer pin 4_1. For example, the electrical power supply has a value of 5 V. The internal structure of the sensor power-supply module 8 is well known to a person skilled in the art and numerous variants are available to them.

In one exemplary embodiment, the sensor power-supply module 8 comprises an electrical power supply which may be a power supply which is internal to the engine control computer 4 and a so-called "pull-up" resistor 12. Said pull-up resistor 12 has the role of biasing the output 2_2 of the voltage-source sensor 2. The pull-up resistor 12 has a first resistor pin 12_1 coupled, on the one hand, to the electric power supply and, on the other hand, to the first sensor power-supply module pin 8_1. It further comprises a second resistor pin 12_2 coupled to a second electric-power-supply module pin 8_2.

The signal processing module 10 is suitable for shaping and/or filtering a signal originating from the voltage-source sensor 2. For this purpose, the signal processing module 10 comprises a first signal processing module pin 10_1, a second signal processing module pin 10_2 and a third signal processing module pin 10_3.

For example, the first signal processing module pin 10_1 is coupled to the second computer pin 4_2 and also to the third signal processing module pin 10_3. The second signal processing module pin 10_2 is coupled to the third computer pin 4_3 and the third signal processing module pin 10_3 is coupled to the second electric-power-supply module pin 8_2. A fourth signal processing module pin 10_4 is suitable for generating a filtered signal for at least one other function of the engine control computer 4.

Furthermore, the internal structure of the signal processing module 10 may comprise a first capacitor 14 having a first first capacitor pin 14_1 and a second first capacitor pin 14_2. The first first capacitor pin 14_1 is coupled to electrical ground and the second first capacitor pin 14_2 is coupled, on the one hand, to a first resistor pin 16_1 and, on the other hand, to the third signal processing module pin 10_3. Furthermore, the third pin 10_3 is coupled to the first pin 10_1. The signal processing module 10 further has a resistor 16 having a second resistor pin 16_2. The second resistor pin 16_2 is coupled to the fourth signal processing module pin 10_4. The values of the various elements, such as the resistors and the capacitor, are well known to a person skilled in the art and are consequently not given here.

Figure 2:
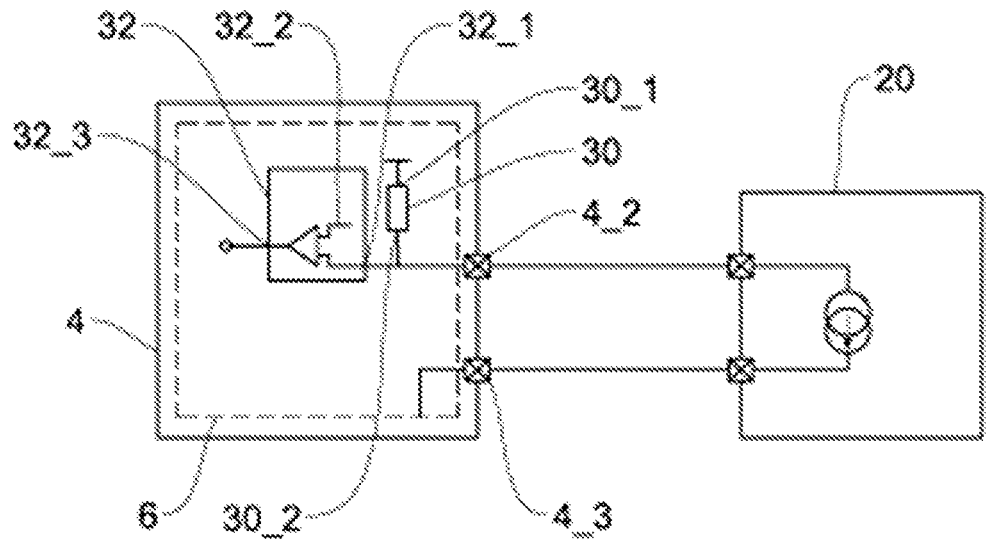
FIG. 2 shows a schematic view of a computer of the prior art coupled to a current-source sensor.

FIG. 2 shows an example of a current-source sensor 20 of the prior art. This current-source sensor 20 operates and is coupled to the engine control computer 4. The current-source sensor 20 delivers information in the form of a current variation requiring a different hardware interface 6 at the level of the engine control computer 4 in order to be able to detect close current levels originating from the current-source sensor 20.

For this purpose, a resistor 30 known by a person skilled in the art as a shunt resistor may be used, comprising a first resistor pin 30_1 and a second resistor pin 30_2. The first resistor pin 30_1 is coupled to the electrical power supply of said engine control computer 4, the second resistor pin 30_2 is coupled, on the one hand, to the second computer pin 4_2 and, on the other hand, to a first conversion device pin 32_1. The conversion device 32 is suitable for comparing and matching the voltage applied to a first conversion device pin 32_1 and the reference voltage applied to the second conversion device pin 32_2.

The conversion device 32 further has a second conversion device pin 32_2 coupled to a reference voltage. The value of the reference voltage may, for example, be 4.5 V. Furthermore, the conversion device 32 has a third conversion device pin 32_3 coupled to internal functions of the engine control computer 4. The latter is therefore suitable for generating an electrical signal in the form of at least two voltage levels which are representative of the current flowing through the shunt resistor 30. Preferably, the shunt resistor 30 has a relatively low value of the order, for example, of 10 ohms.

As mentioned above in the text of the description, for each type of sensor 2, 20, it is therefore, upstream, necessary to modify the internal structure of the hardware interface 6.

Figure 3:
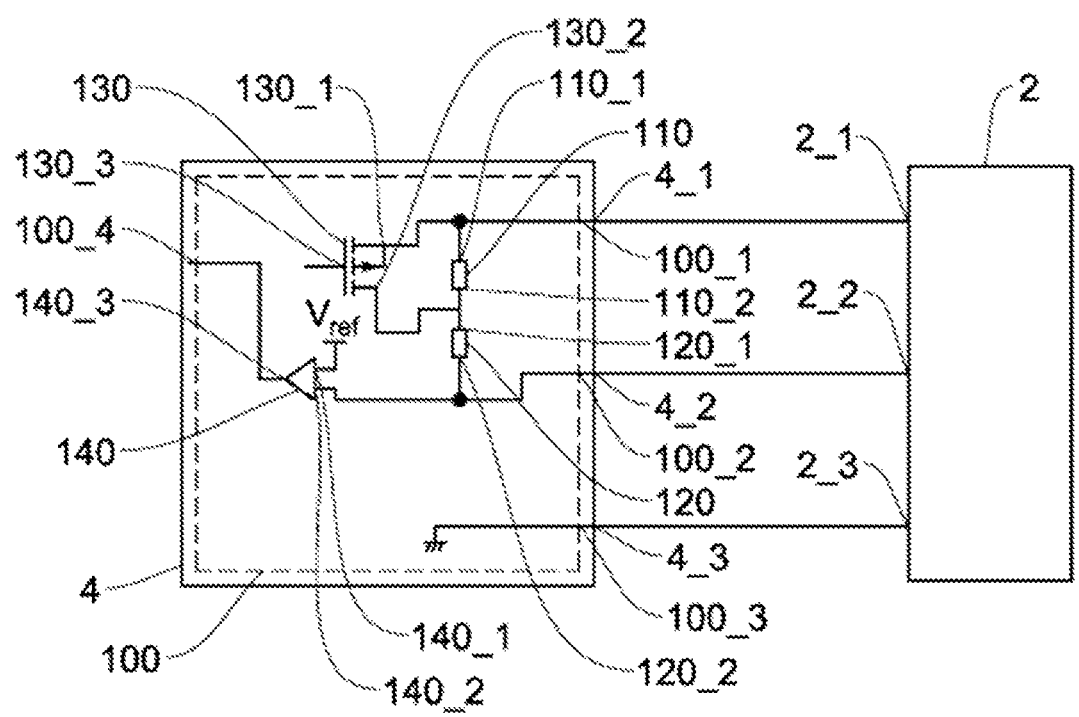
FIG. 3 shows a schematic view of a computer comprising a hardware interface according to an aspect of the invention.

An aspect of the invention proposes, as illustrated in FIG. 3, a hardware interface 100 allowing the coupling either of a voltage-source sensor 2 or of a current-source sensor 20 without modifying the internal structure of the hardware interface 100 upstream.

For this purpose, ingeniously, what is proposed is a hardware interface 100 which is suitable for connecting, to the engine control computer 4, either a voltage-source sensor 2 or a current-source sensor 20 without any need to modify the hardware interface 100 of said engine control computer 4. Thus, advantageously, the hardware interface 100 is compatible with the two types of sensors 2, 20.

The hardware interface 100 comprises, in one preferred embodiment, a first hardware interface input 100_1, a second hardware interface input 100_2 and a third hardware interface input 100_3 which are coupled, respectively, to the first computer pin 4_1, to the second computer pin 4_2 and to the third computer pin 4_3. The hardware interface 100 further comprises a first hardware interface output 100_4 coupled to devices which are internal and/or external to the engine control computer 4.

The hardware interface 100 comprises a first resistor 110, a second resistor 120, a transistor 130, and a comparator 140.

The first resistor 110 comprises a first first resistor pin 110_1 and a second first resistor pin 110_2. The second resistor 120 comprises a first second resistor pin 120_1 and a second second resistor pin 120 _2. The first first resistor pin 110_1 is coupled, on the one hand, to the first hardware interface pin 100_1 and, on the other hand, to a first transistor pin 130_1. The second first resistor pin 110_2 is coupled, on the one hand, to the first second resistor pin 120_1 and, on the other hand, to a second transistor pin 130_2. Furthermore, the transistor 130 comprises a third transistor pin 130_3 corresponding, in the case of a MOS (metal-oxide-semiconductor) transistor 130, to the gate, as known by a person skilled in the art.

The second second resistor pin 120_2 is coupled, on the one hand, to the second hardware interface pin 100_2 and, on the other hand, to a second comparator input 140_2. The comparator 140 further comprises a first input 140_1 coupled to a reference voltage which may have, in one exemplary embodiment, a value of 4.5 V. The first comparator output 140_3 is coupled to the first hardware interface output 100 _4. The third hardware interface input 100_3 is coupled to a ground of the motor vehicle.

Advantageously, by virtue of the hardware interface 100 according to an aspect of the invention and, more precisely, by virtue of the combination of the coupling of the first resistor 110, of the second resistor 120 and of the transistor 130, it is possible to select a low impedance value corresponding to the value of the second resistor 120 or a high impedance value corresponding to the value of the first resistor 110 added to the value of the second resistor 120 between the first hardware interface pin 100_1 and the second hardware interface pin 100_2. What is understood by low impedance value is a value of the order of ten ohms and by high impedance value a value of the order of a thousand ohms. Thus, advantageously, by virtue of selecting the impedance value it is possible to connect, to the terminals of the computer 4, either a voltage-source sensor 2 or a current-source sensor 20 without modifying the hardware interface 100.

As mentioned above in the text of the description, either a voltage-source sensor 2 or a current-source sensor 20 may thus be coupled to the first computer pin 4_1, to the second computer pin 4_2 and to the third computer pin 4_3.

Figure 4:
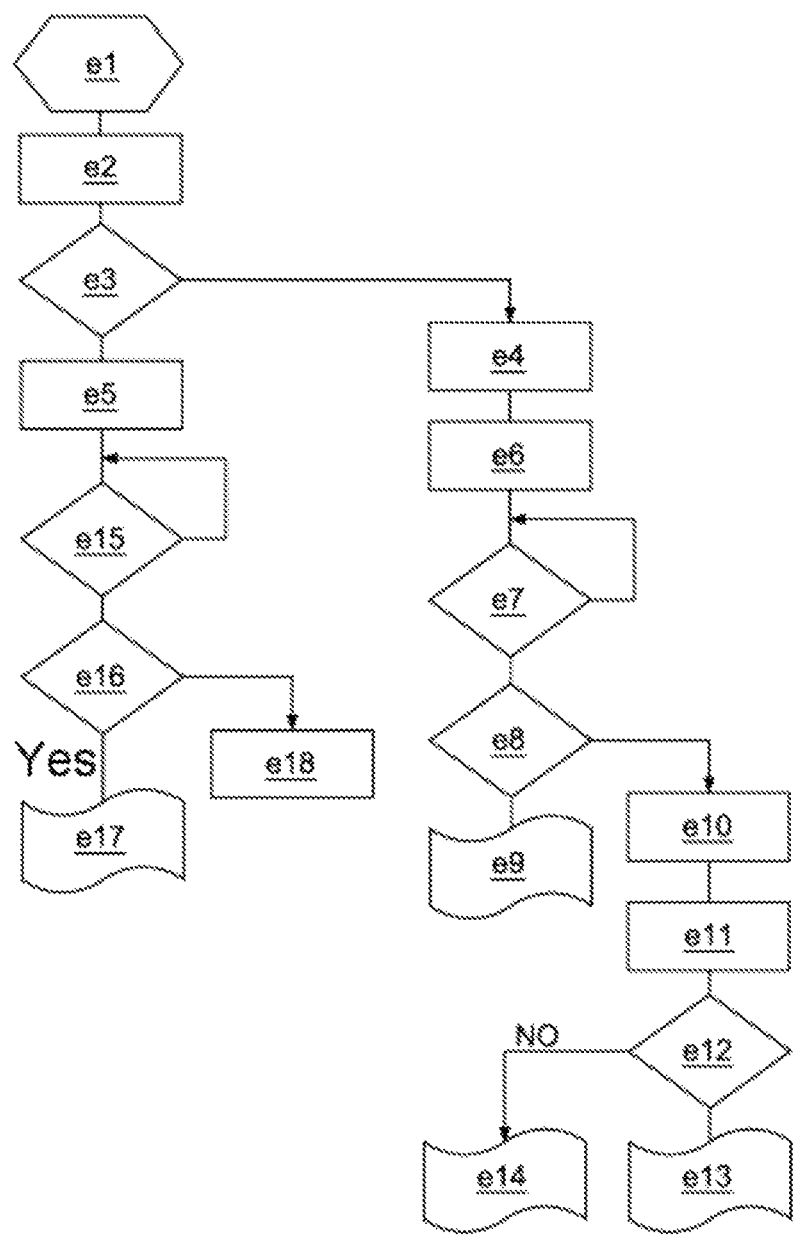
FIG. 4 shows an algorigram of the method according to an aspect of the present invention.

An aspect of the invention further proposes a method, as shown in FIG. 4, for controlling the hardware interface 100 which automatically allows the type of sensor 2 or 20 coupled to the engine control computer 4 to be detected.

The method according to an aspect of the present invention has a first step e1 consisting in switching the transistor 130 to a closed state allowing the first resistor 110 to be shorted. Thus, during this first step e1, an impedance equivalent to the impedance of the second resistor 120 is applied between the first computer pin 4_1 and the second computer pin 4_2. The transistor 130 is controlled by a control signal applied to the third pin 130_3 of said transistor. Such a control signal is well known to a person skilled in the art and it will consequently not be presented or explained further.

During a second step e2, a signal which is present on the first hardware interface output 100_4 is read which is representative of an input voltage of the sensor 2 coupled to the engine control computer 4. The second step e2 may be performed by a module which is internal to the engine control computer 4 which will not be presented here because it is unnecessary for understanding the method of an aspect of the invention. Once the signal which is present at the first hardware interface output 100_4 has been read, a third step e3 is performed next.

During the third step e3, the value of the signal which is present at the first hardware interface output 100_4 is compared with a reference value Vref1. In one exemplary embodiment, in the event that the result of the comparison is positive, representative of a high level at the first hardware interface output 100_4, then the method envisages moving to a fourth step e4 and, in the event that the result of the comparison is negative, moving to a sixth step e6. In one exemplary embodiment, the value of the signal which is present at the first output 100_4 is compared by a module which is external to the hardware interface 100.

According to the method of an aspect of the invention, in the event that the result of the comparison is positive (third step e3), the meaning of this according to the fourth step e4 is that a voltage-source sensor 2 is probably coupled to the engine control computer 4 allowing, for example, the detection/calibration time when installing a new sensor on the vehicle to be optimized. Furthermore, during this fourth step e4, the transistor 130 is controlled in open-circuit mode, that is to say that the first resistor 110 is no longer shorted by the transistor 130, in order to apply, between the first computer pin 4_1 and the second computer pin 4_2, an impedance which is compatible with a voltage-source sensor 2 coupled to said pins.

According to the method of an aspect of the invention, over a sixth step e6, a software configuration of the hardware interface 100 is performed in order to allow the signals delivered by the voltage-source sensor 2 to be read.

According to the method of an aspect of the invention, over a seventh step e7, information that the starter of the vehicle has been controlled is scanned for and detected. Advantageously, according to an aspect of the method of the invention an eighth step e8 is not launched as long as said information that the starter has been launched is not detected.

Over the eighth step e8 the method of an aspect of the invention proposes to check the presence and the correct operation of the voltage-source sensor 2 coupled between the first computer pin 4_1 and the second computer pin 4_2. For this purpose, the method, over the eighth step e8, analyzes the signal originating from the sensor coupled to the pins 4_1 and 4_2 over a given period. This given period may be, for example, a few milliseconds (ms), the time required for the movement of at least one tooth of a notched wheel coupled to a crankshaft, which is representative of an activation of said engine by the starter.

In the event that, over the given period, a frequency variation in the signal originating from the voltage-source sensor 2 is detected, then the method according to an aspect of the present invention proposes moving to a ninth step e9. In the event that no frequency variation in the signal originating from the voltage-source sensor 2 is detected, then the method according to an aspect of the present invention proposes moving to a tenth step e10.

Advantageously, over the ninth step e9 the method according to an aspect of the present invention confirms the presence and the correct operation of the voltage-source sensor 2 across the terminals of the computer 4.

Advantageously, the method according to an aspect of the present invention, during the tenth step e10, tests the sensor 2, 20 coupled to the computer 4. This is because the absence of frequency variation in the signal originating from the voltage-source sensor 2 across the terminals of the computer 4 may be synonymous with several scenarios. These may be either the presence of a current-source sensor 20 coupled to the computer 4 instead of a voltage-source sensor 2, or the presence of an anomaly at the level of said coupled sensor 2, 20 not allowing the type of coupled sensor 2, 20 to be determined.

In order to determine the anomaly as being present, the method according to an aspect of the present invention proposes, over the tenth step e10, to position the transistor 130 in closed/short-circuit mode in order to short the first resistor 110 and therefore to position the hardware interface 100 in a software configuration mode for a current-source sensor 20. In this embodiment, the impedance applied between the first computer pin 4_1 and the second computer pin 4_2 is compatible with that of a current-source sensor 2.

The method proposes next to move to an eleventh step e11, in which a software configuration of the hardware interface 100 in order to allow the signals delivered by the current-source sensor 20 to be read before moving to a twelfth step e12 is performed.

Over the twelfth step e12, the presence and the correct operation of a current-source sensor 20 coupled between the first computer pin 4_1 and the second computer pin 4_2 are checked. For this purpose, the method analyzes the signal originating from the sensor 2, 20 coupled to the pins 4_1 and 4_2 over a given period, for example a few milliseconds (ms), the time required for the movement of at least one tooth of a notched wheel coupled to a crankshaft, which is representative of an activation of said engine by the starter.

In the event that, over the given period, a frequency variation in the signal originating from the current-source sensor 20 is detected, then the method according to an aspect of the present invention proposes moving to a thirteenth step e13. In the event that no frequency variation in the signal originating from the current-source sensor 20 is detected, then the method according to an aspect of the present invention proposes moving to a fourteenth step e14.

Advantageously, over the thirteenth step e13 the presence and the correct operation of the current-source sensor 20 coupled to the terminals of the computer 4 are detected and confirmed.

Advantageously, over the fourteenth step e14 of the method of an aspect of the invention an anomaly at the level of the sensor 2, 20 coupled to the computer 4 is confirmed.

According to the method of an aspect of the invention, in the event that the result of the comparison is negative (third step e3), the meaning of this according to the fifth step e5 is that a current-source sensor 20 is probably coupled to the engine control computer 4 allowing, for example, the detection/calibration time when installing a new sensor on the vehicle to be optimized. Advantageously, over the fifth step e5 a software configuration of the hardware interface 100 is performed in order to allow the signals delivered by the current-source sensor 20 to be read.

According to the method of an aspect of the invention, over a fifteenth step e15, information that the starter of the vehicle has been controlled is scanned for and detected.

Advantageously, according to the method of an aspect of the invention a sixteenth step e16 is not launched as long as said information that the starter has been launched is not detected.

Over the sixteenth step e16 the method of an aspect of the invention proposes to check the presence and the correct operation of the current-source sensor 20 coupled between the first computer pin 4_1 and the second computer pin 4_2. For this purpose, the method, over the sixteenth step e16, analyzes the signal originating from the sensor coupled to the pins 4_1 and 4_2 over a given period. This given period may be, for example, a few milliseconds (ms), the time required for the movement of at least one tooth of a notched wheel coupled to a crankshaft, which is representative of an activation of said engine by the starter.

In the event that, over the given period, a frequency variation in the signal originating from the current-source sensor 20 is detected, then the method according to an aspect of the present invention proposes moving to a seventeenth step e17. In the event that no frequency variation in the signal originating from the current-source sensor 20 is detected, then the method according to an aspect of the present invention proposes moving to an eighteenth step e18.

Advantageously, over the seventeenth step e17 the method according to an aspect of the present invention confirms the presence and the correct operation of the current-source sensor 20 across the terminals of the computer 4.

Over the eighteenth step e18 the method according to an aspect of the present invention confirms the presence of an anomaly at the level of the current-source sensor 20. In the event that an anomaly is detected, this anomaly is advantageously confirmed as being a short-circuit to ground anomaly for the current-source sensor 20.

By virtue of an aspect of the invention, it is now possible to detect the presence of a voltage-source and/or current-source sensor across the terminals of an engine control computer automatically. Furthermore, it is possible to change the type of sensor over the lifespan of the engine control computer without changing the latter depending on the type of sensor. Moreover, it is now also possible to detect certain types of anomalies at the level of the sensor.

The electronic circuits of the hardware interface are given by way of illustration and are in no way limiting with regard to the scope of an aspect of the invention. In relation to the sequencing of the steps of the method of an aspect of the invention and the number thereof, they are also given by way of illustration and a person skilled in the art will be able to modify them as required in order to arrive at the same result.

The invention claimed is:
1. A method for automatically detecting a sensor coupled to an electronic computer, the method comprising:
    a first step e1), consisting in switching a transistor in order, on the one hand, to short a first resistor and, on the other hand, to apply, between a first computer pin and a second computer pin, an impedance of the order of a second resistor, a second step e2), consisting in reading a signal generated by said sensor coupled to the computer, a third step e3), consisting in comparing the value of the signal generated by the sensor coupled to the computer with a reference value, in the event that the result of the comparison in the third step e3) is positive, performing:

- a fourth step e4), consisting in configuring a hardware interface in voltage-source sensor mode, and in controlling the transistor in open-circuit mode, wherein the first resistor is no longer shorted by the transistor,
- a sixth step e6), consisting in a software configuration of the hardware interface which is suitable for allowing the signals delivered by the voltage-source sensor to be read,
- a seventh step e7), consisting in monitoring and in detecting information that a starter of a vehicle has been controlled,
- an eighth step e8), consisting in checking the presence and the correct operation of the voltage-source sensor coupled between the first computer pin and the second computer pin,
- in the event that a frequency variation in the signal delivered by the voltage-source sensor is detected, performing a ninth step e9), which is representative of the correct operation of the voltage-source sensor, consisting in confirming said presence and said correct operation of the voltage-source sensor across the terminals of the computer,
- in the event that a frequency variation in the signal delivered by the voltage-source sensor is not detected, performing:
  - a tenth step e10), which is representative of a potential anomaly of the sensor, consisting in switching the transistor in short-circuit mode, to short the first resistor and to position the hardware interface in a software configuration mode for a current-source sensor, configuring the hardware interface in current-source sensor mode,
  - an eleventh step e11), consisting in a software configuration of the hardware interface which is suitable for allowing the signals delivered by the current-source sensor to be read,
  - a twelfth step e12), consisting in checking the presence and the correct operation of the current-source sensor coupled between the first computer pin and the second computer pin,
  - in the event that a frequency variation in the signal delivered by the current-source is detected, performing a thirteenth step e13), which is representative of the correct operation of the current-source sensor, consisting in confirming said presence and said correct operation of the current-source sensor across the terminals of the computer, and
  - in the event that a frequency variation in the signal delivered by the current-source is not detected, performing a fourteenth step e14), which is representative of the presence of an anomaly, consisting in confirming an anomaly at the level of the sensor coupled to the computer, in the event that the result of the comparison in the third step e3) is negative, performing:

- a fifth step e5), which is representative of a negative comparison result in step e3, consisting in configuring the hardware interface in current-source sensor mode, and in a software configuration of the hardware interface in order to allow the signals delivered by the current-source sensor to be read,
- a fifteenth step e15), consisting in repeatedly monitoring and detecting information that the starter of the vehicle has been controlled, and
- a sixteenth step e16), consisting in checking the presence and the correct operation of the current-source sensor coupled between the first computer pin and the second computer pin,
- in the event that a frequency variation in the signal delivered by the current-source is detected, performing a seventeenth step e17), which is representative of the correct operation of the current-source sensor, consisting in confirming said presence and said correct operation of the current-source sensor across the terminals of the computer,
- in the event that a frequency variation in the signal delivered by the current-source is not detected, performing an eighteenth step e18), which is representative of the presence of an anomaly and consists in confirming an anomaly at the level of the current-source sensor coupled to the computer.

\* \* \* \* \*